United States Patent [19]
Hodges

[11] Patent Number: 5,976,955
[45] Date of Patent: Nov. 2, 1999

[54] PACKAGING FOR BARE DICE EMPLOYING EMR-SENSITIVE ADHESIVES

[75] Inventor: Joe W. Hodges, Boise, Id.

[73] Assignee: Micron Technology, Inc., Boise, Id.

[21] Appl. No.: 08/884,902

[22] Filed: Jun. 30, 1997

Related U.S. Application Data

[63] Continuation-in-part of application No. 08/659,268, Jun. 6, 1996, Pat. No. 5,775,510, which is a continuation of application No. 08/368,516, Jan. 4, 1995, Pat. No. 5,590,787.

[51] Int. Cl.$^6$ .......................... H01L 21/301; H01L 21/46; H01L 21/78
[52] U.S. Cl. .......................... 438/464; 438/106; 438/113; 438/118; 156/247; 156/344; 156/272.2; 156/379.6
[58] Field of Search ................................. 438/106, 113, 438/118, 464; 156/247, 344, 272.2, 379.6

[56] References Cited

U.S. PATENT DOCUMENTS

| | | | |
|---|---|---|---|
| 4,702,788 | 10/1987 | Okui | 156/252 |
| 4,720,317 | 1/1988 | Kuroda et al. | 156/250 |
| 5,020,959 | 6/1991 | Soth . | |
| 5,158,818 | 10/1992 | Auricho | 428/40 |
| 5,203,143 | 4/1993 | Gutentag | 53/452 |
| 5,295,778 | 3/1994 | Hirai et al. . | |
| 5,299,902 | 4/1994 | Fujiwara et al. . | |
| 5,423,931 | 6/1995 | Inoue et al. | 156/94 |
| 5,534,094 | 7/1996 | Arjavalingam et al. | 156/155 |
| 5,590,787 | 1/1997 | Hodges . | |
| 5,648,136 | 7/1997 | Bird . | |

*Primary Examiner*—John F. Niebling
*Assistant Examiner*—David A. Zarneke
*Attorney, Agent, or Firm*—Trask, Britt & Rossa

[57] ABSTRACT

A structure and method for protecting semiconductor integrated microcircuit dice during shipping. The structure secures the position of the die or dice atop an EMR-penetrable element using an adhesive layer, the stickiness, adhesiveness or coefficient of friction of which is alterable by exposure to EMR of a predetermined wavelength range, such as ultraviolet light. Once the structure reaches its destination, prior to removal of the dice, the adhesive layer is exposed to EMR, such as ultraviolet light, through the element. This exposure reduces the stickiness, adhesiveness, or coefficient of friction of the adhesive to facilitate die removal. The EMR-sensitive adhesive does not leave contaminating silicon residue on the removed die. The invention may be realized using currently commercially available UV tape and modified die-pac designs having UV light penetrable die transport portions, or tape-and-reel type die transport structures.

4 Claims, 7 Drawing Sheets

PACKAGING FOR BARE DICE EMPLOYING EMR-SENSITIVE ADHESIVES

This application is a continuation-in-part of U.S. application Ser. No. 08/659,268, filed Jun. 6, 1996, now U.S. Pat. No. 5,775,510, which is a continuation of U.S. application Ser. No. 08/368,516, filed Jan. 4, 1995, now U.S. Pat. No. 5,590,787.

BACKGROUND OF THE INVENTION

1. Field of the Invention

This invention relates to semiconductor integrated microcircuit manufacturing and more particularly to temporarily packaging singulated integrated circuit dice for shipping.

2. State of the Art

Semiconductor integrated circuit chips are typically constructed en masse on a single wafer or other substrate of silicon or other semiconductor material. After the circuits are created, the wafers or substrates are split up, or "singulated", into individual integrated circuit chips or dice. Typically, each die is then individually encapsulated into integrated circuit packages which are capable of being attached to printed circuit boards. However, dice are often sold or transferred to other manufacturing sites in the unpackaged form. The unpackaged dice must therefore be shipped through the mail or by other freight means to destinations which can be cities, states or even countries apart. Freight travel often involves subjecting articles so transported to a harsh, contaminant-laden environment in terms of dirt and dust, as well as mechanical shock and vibration. This environment requires that the dice be temporarily packaged to protect them from such exposure.

Figure 1:
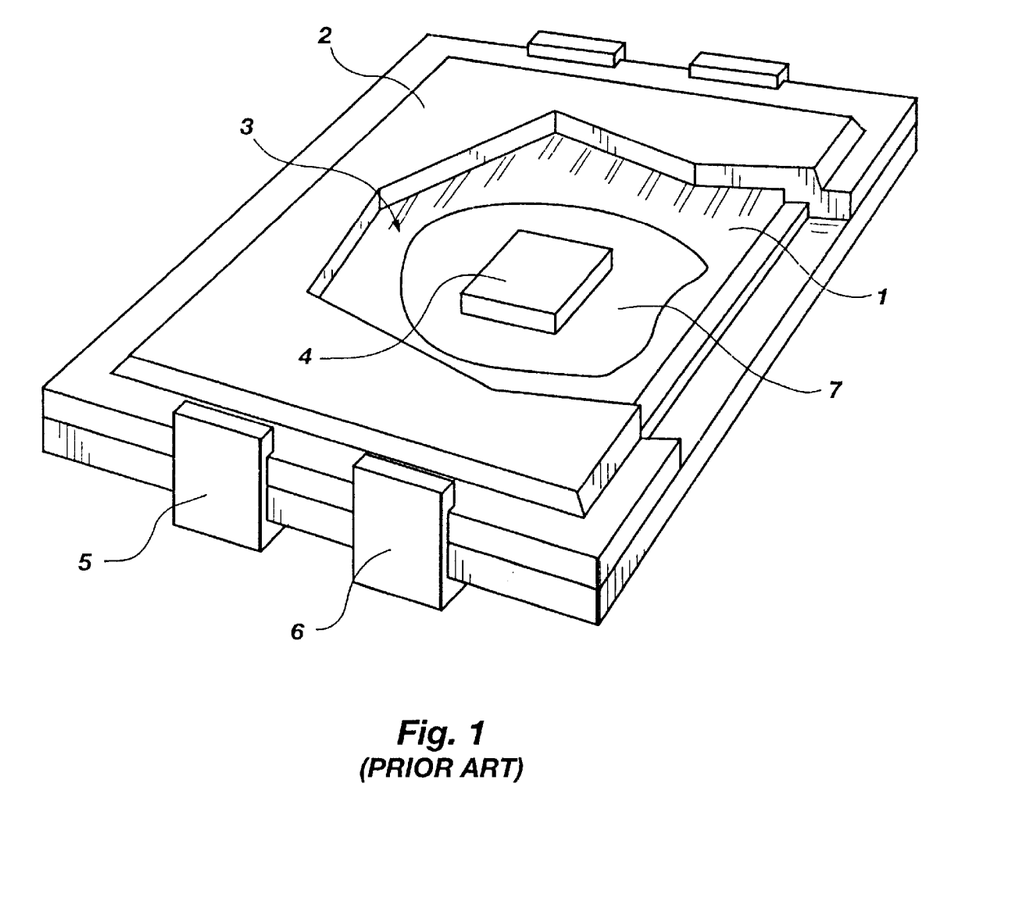
FIG. 1 is a perspective cut-away view of a prior art die-pac using silicone gel adhesive as the die-securing means.

Over the years, the industry has developed packages called die-pacs which temporarily contain the dice during shipping. Currently, die-pacs are protective containers similar to that shown in FIG. 1. The containers are made of black conductive polypropylene to keep out dust and other contaminants and to protect the die from static charges and from crushing and impact type forces caused by rough handling. The container comprises a lower bed structure 1 which is capable of being mated to a cover structure 2. When mated, an inner cavity 3 is formed for storing the die 4 or dice. The bed and cover are held together through temporary securing means such as interlocking clasp brackets 5 and 6. The position of the die within the cavity of the container is secured by a layer of silicone gel adhesive material 7 contacting the undersurface of the die and a surface of the bed facing the inner cavity.

The silicone gel is similar to common household cellophane wrapping material. However, silicone gel has greater resiliency and will not hold a static electric charge of any significance.

Prior to shipping, the singulated dice are placed atop the silicone gel layer on the bed through robot deposit or other means. The cover is then mated and secured to the bed using the interlocking clasp brackets. The die-pac is then ready for shipment.

Upon arrival of the die-pac at its destination, the interlocking clasp brackets are removed and the cover lifted from the bed. Robot-operated pickup means then remove the die or dice from the bed.

There are, however, certain problems which have arisen using the popular silicone gel die-pac. First, the adhesive nature of the silicone gel, which is strong enough to maintain the position of the die during transport, requires either expensive manual removal of the dice or that the robot pickup means be sufficiently strong to remove the die from the gel. This relatively powerful pickup means sometimes can damage the sensitive die during the pickup operation. When less strong means are used, there are often many unsuccessful attempts made before the die is picked-up. Repetitive attempts to pick-up a die increases the probability of damaging the die during the pick-up process.

Second, it has been found that residue from the silicone gel often contaminates portions of the die. This residue is in the form of silicon compounds such as silicon oxides and silicon-metal compounds. Tests have shown particularly high concentrations of compounds such as polydimethylsiloxane ($CH_3$—$(Si—O)_n$—$CH_3$). These compounds generally contaminate the surfaces of a die, resulting most commonly in reduced conductivity of the die's electrical contact points, thereby forcing further costly processing prior to packaging. Severe contamination will even cause a die to be non-functional.

Therefore, it would be valuable to have a method for shipping singulated dice which does not subject the dice to the problems associated with the prior art packaging techniques as referenced above.

BRIEF SUMMARY OF THE INVENTION

The present invention provides packaging and methods for inexpensively protecting singulated dice during shipping from contamination and damage, as well as facilitating removal of the singulated dice from packaging upon reaching their destination.

The invention may utilize current die-pac structural designs so as to minimally impact the current automation devices for loading and removing dice from shipping die-pacs, although the invention is not so limited, as set forth in greater detail below.

The invention provides a die-pac which allows less powerful means for removing the dice from the die-pac after it has reached its destination.

These and other advantages are achieved by a structure having an ultraviolet (UV) light or other electromagnetic radiation (EMR) transmissive or penetrable plate upon which has been placed a layer of UV light or other EMR-sensitive adhesive for securing the position of the die or dice during shipping. The adhesive is sensitive to selected, predetermined wavelengths of EMR in that its adhesiveness, stickiness or coefficient of friction is alterable by exposing the adhesive to such selected wavelengths of EMR, such as UV light. Upon arrival of the structure at its destination, the adhesive is subjected to an EMR source emitting such radiation within the selected wavelengths, thereby reducing its adhesiveness, and allowing for less powerful pickup of the dice during removal. The specific adhesive used as disclosed herein provides less harmful silicon residues to the dice during shipping.

The structure of the invention is readily adaptable to current die-pac designs having a matable bed and cover for enclosing the die or dice for protection during shipping. Such die-pac designs may be simplified in construction in comparison to current die-pacs to provide less expensive, while still adequate, protection for the bare dice under transport.

Further, it is also contemplated that the present invention may be embodied in the form of a tape-and-reel transport system for bare dice.

DETAILED DESCRIPTION OF THE INVENTION

Figure 2:
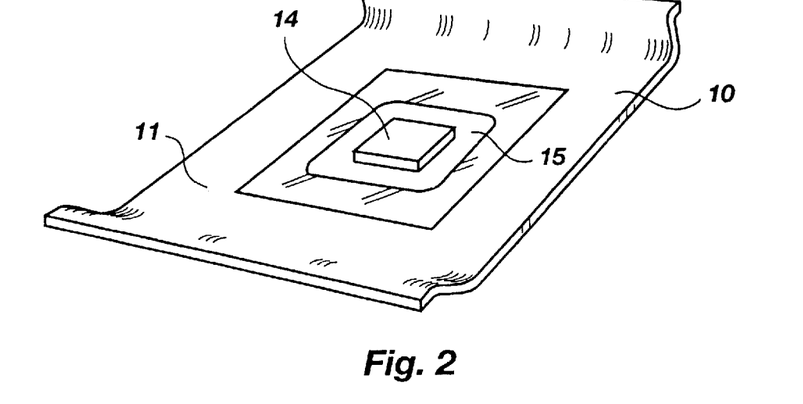
FIG. 2 is a perspective view of a die holding bed according to the invention.
Figure 3:
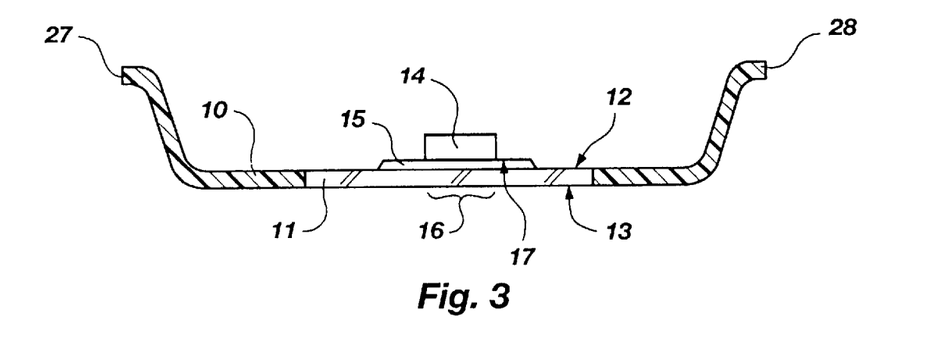
FIG. 3 is a cross-sectional end view of the die holding bed of FIG. 2.

Referring now to the drawing, FIGS. 2 and 3 respectively show a perspective view and a cross-sectional end view of a structure according to the invention for releasably holding a microcircuit die. The structure comprises a bed structure 10 made of substantially rigid conductive material such as black conductive polypropylene. A portion of the bed forms a plate 11 made of material which is penetrable by (i.e., transmits) ultraviolet (UV) light, such as substantially clear plastic, glass or polycarbonate. The plate 11 has an upper face 12 and a lower face 13. The position of the die 14 is secured above a section 16 of the plate by a layer of ultraviolet light sensitive adhesive 15 contacting the undersurface 17 of the die.

Upon arrival of the holding structure at its destination, the lower face 13 of the plate portion of the bed is subjected to UV light of sufficient intensity. The light penetrates through the plate and into the UV light-sensitive adhesive layer existing between the die and the upper face of the plate. This exposure reduces the coefficient of friction of the adhesive. The die can then be easily removed through vacuum pick-up means.

Figure 4:
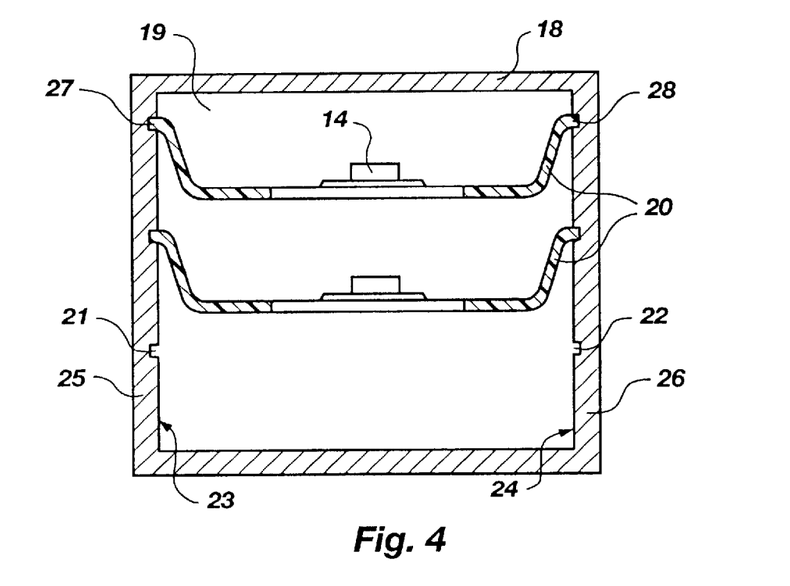
FIG. 4 is a cross-sectional end view of a vessel structure capable of containing one or more die holding beds during shipping.

FIG. 4 shows that one or more of the holding beds may be loaded into a vessel structure 18 to further protect the die 14 or dice from the shipping environment, which may include dust, heat, shock, vibration and static charges. The structure comprises at least one cavity 19 capable of enclosing a die or dice, and means for securing the position of the die or dice within the cavity. In this case, the vessel may contain a plurality of holding beds 20. The means for securing comprise a pair of parallel grooves 21, 22 for each holding bed to be loaded into the vessel. Each pair of grooves is set into the inner surface 23, 24 of parallel walls 25, 26 of the vessel. The grooves are sized and dimensioned to releasably engage opposite ends 27, 28 of a holding bed. Upon arrival of the vessel at its destination, the vessel may be opened and the holding beds removed to be irradiated.

Figure 5:
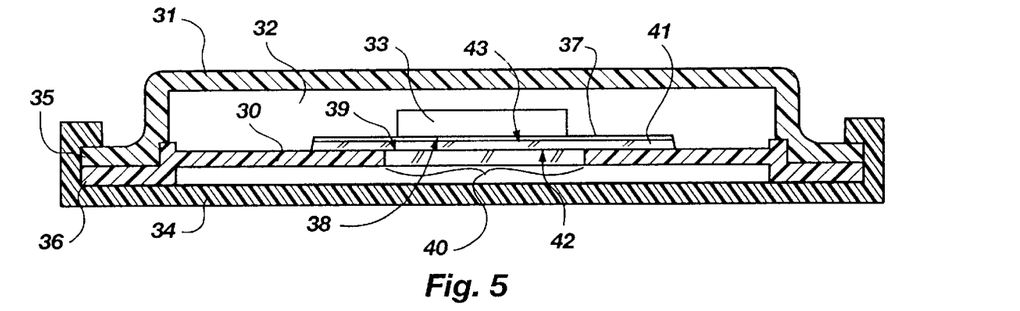
FIG. 5 is a cross-sectional end view of a die-pac according to the invention.

An alternate embodiment of the invention is directed toward implementation of the invention using the typical, currently used die-pac structure. FIG. 5 shows a cross-sectional end view of a typical die-pac structure. The die-pac is a container which comprises a lower bed structure 30 which is capable of being mated to a cover structure 31. The cover and the bed are made of protective, hard, conductive material such as black conductive polypropylene. Once mated, an inner cavity 32 is formed between the bed and cover. The cavity is sized and dimensioned to contain the die 33 therein. The bed and cover are held together through temporary securing means such as interlocking clasp brackets 34 which engage the edge flanges 35, 36 of the mated bed and cover.

The position of the die within the cavity of the container is held by a layer of ultraviolet light-sensitive adhesive 37 contacting the undersurface 38 of the die and secured over the upper face 39 of a plate portion 40 of the bed structure 30. As in the previous embodiment, the plate portion 40 is made of UV light-penetrable material such as transparent plastic, glass, or polycarbonate.

Figure 5A:
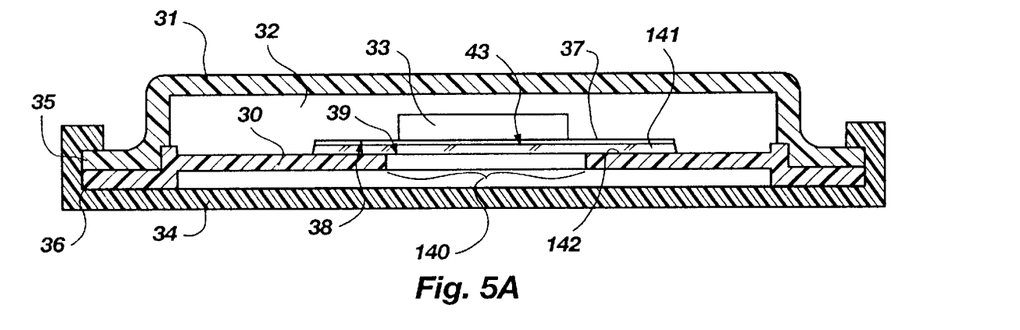
FIG. 5A is a cross-sectional end view of a die-pac similar to that of FIG. 5, but having a simplified structure.

In this embodiment, the adhesive layer is formed using ultraviolet sensitive tape (UV tape) of the type which is currently used to hold IC wafers firmly in place during the singulation process. UV tape typically comprises a layer of ultraviolet curable, pressure sensitive adhesive 37 such as acrylic attached to a UV-penetrable polyvinyl chloride backing 41. The backing 41 has an undersurface 42 which is secured above the upper face 39 of the plate 40 and a top surface 43 which carries the UV-sensitive adhesive 37. The undersurface 42 may be secured directly to the upper face 39 using any number of means available in the art such as epoxy. However, the means used must not substantially interfere with the penetration of UV light through the plate portion 40 and onto the UV-sensitive adhesive 37. Alternatively, as shown in FIG. 5A, plate portion 40 may be eliminated from the bed structure 30 and an aperture 140 employed instead, backing 41 then comprising a more robust or thicker material (such as a thicker tape) bonded at its edges 142 over aperture 140 using adhesives, heat, ultrasound or other techniques known in the art.

UV tape is currently available from suppliers such as Kanematsu USA, Inc., of New York, N.Y. under the brand name Furukawa UV Tape; Uniglobe Kisco Co., of Santa Clara, Calif., under the brand name Bando Dicing Tape; and others. Although UV-sensitive adhesive tape is the preferred adhesive, other EMR-sensitive adhesives such as glues and gels may be used in place of the UV tape without departing from the invention.

Figure 6:
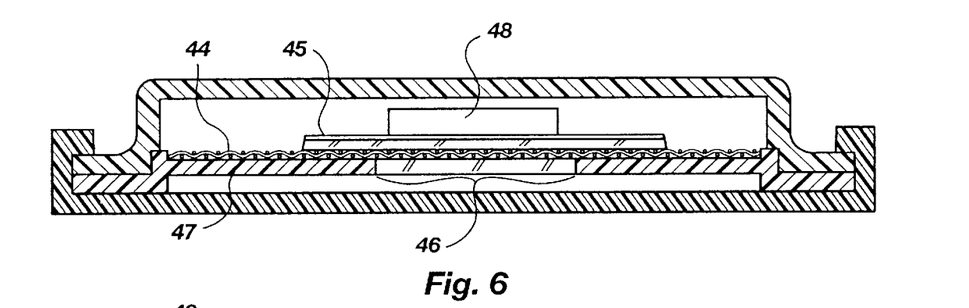
FIG. 6 is a cross-sectional end view of an alternate embodiment of a die-pac constructed according to the invention having a nylon web interposed between the tape and the bed surface.

FIG. 6 shows an alternate embodiment of the invention wherein a layer of webbing material 44 has been interposed between a UV-sensitive adhesive layer 45 and a UV-penetrable plate portion 46 of a support bed 47. The webbing further protects the die 48 from mechanical shock.

The webbing must either be made from UV transparent material or woven coarse enough to allow UV light to pass through to the tape. The webbing is preferably made of nylon.

Figure 7:
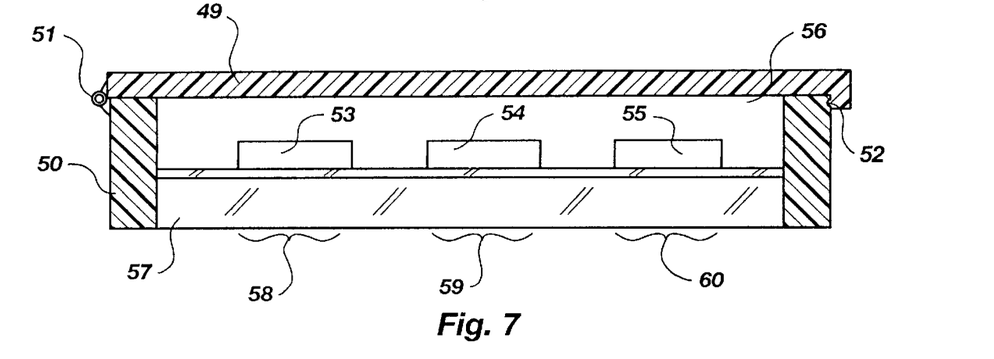
FIG. 7 is a cross-sectional end view of an alternate embodiment of a die-pac constructed according to the invention showing multiple dice and a bed portion made completely of EMR-transmissive material.

FIG. 7 shows an alternate embodiment of the invention wherein different means are used to attach a die-pac cover 49 to a bed structure 50. Here is shown a hinged connection 51 between the bed and cover which can be snapped closed using a common prong/detent snap mechanism 52. This embodiment is included to show that many well-known means for releasably enclosing dice may be used without departing from the invention.

This embodiment further shows that more than one die 53, 54 and 55 may be placed within the cavity 56 formed between the cover and bed of the die-pac. The UV-penetrable plate portion 57 of the bed is shown extending across the length of the cavity. This is not required. All that is required is that sections 58, 59 and 60 of the bed located beneath the dice be capable of passing UV light and allowing the adhesive layer to be exposed.

In general, any means for containing the dice may be used without departing from the invention so long as those means allow for the penetration of electromagnetic radiation which will reduce the coefficient of friction of the adhesive layer.

As stated above, all of the structure below the adhesive layer must be penetrable by the UV light, including the UV tape backing. When webbing is used, it must be penetrable. In this respect, the structure below the adhesive layer may be referred to collectively as the EMR-penetrable "plate" portion.

The pre-exposure stickiness, level of adhesion or coefficient of friction of the UV-sensitive adhesive should generally be strong enough to securely hold the dice during the rigors of shipping, and be weak enough after exposure and curing to allow for vacuum pick-up. The adhesive should not contain a significant concentration of any undesirable compounds which would result in contamination of the die or dice.

X-ray photoelectron spectroscopy (XPS) tests performed on dice exposed to an amount of silicone gel and dice exposed to a comparable amount of UV tape reveal generally that the UV tape exhibits about one half the amount of contamination of silicone gel.

Although UV light is used in the preferred embodiment, other types of electro-magnetic radiation may be used so long as the plate portion is penetrable by it, and the adhesive layer is sensitive to it. For the commercially available UV-sensitive adhesive tape disclosed above and for most clear plastic, glass or polycarbonate, UV light having a wavelength of between 250 and 350 nanometers has been found to be adequate. UV sensitive adhesives by different manufacturers are responsive to different but largely overlapping wavelength ranges, and the invention may thus be practiced effectively with such different adhesives using a wide-spectrum UV source.

Figure 8:
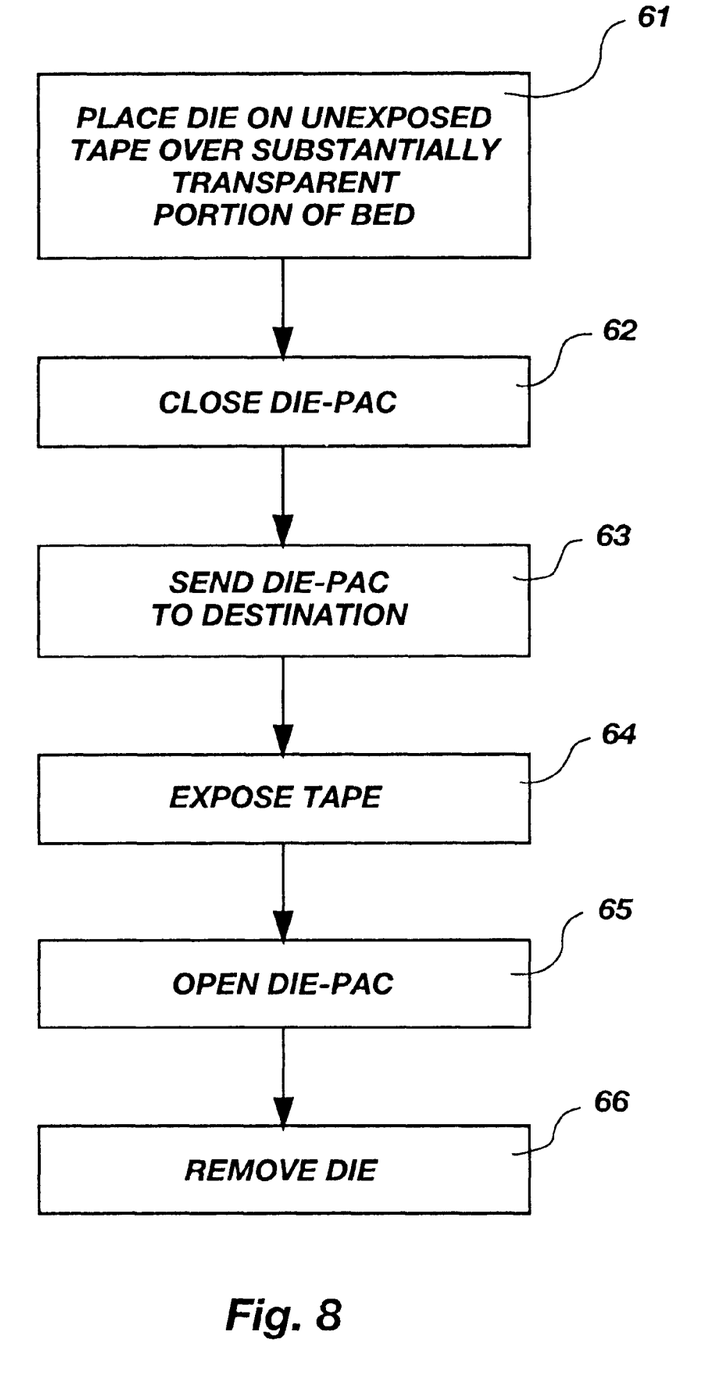
FIG. 8 is a block diagram of the steps necessary for shipping singulated dice packaged in die-pacs according to the invention.

FIG. 8 shows exemplary process steps for transporting or shipping a singulated die according to the invention. The process begins with placing 61 the die on an unexposed UV-sensitive layer of adhesive such as UV tape attached to the upper surface of a substantially transparent portion of a bed. The term "substantially transparent" in this specification means that the portion is capable of passing through UV light with a satisfactorily low amount of attenuation. The next step involves enclosing 62 the die within the die-pac and sending 63 the die-pac to its destination. During transport, the die-pac should not be irradiated by any UV light source. This is usually accomplished by placing the die-pac within an opaque antistatic bag. Upon arrival, there are the steps of: exposing 64 a portion of the tape existing between the die and the substantially transparent portion of the bed to electromagnetic radiation in the form of ultraviolet light; opening 65 the die-pac; and removing 66 the die from the die-pac. The exposing step may occur prior to or after the opening step of the die-pac.

Figure 9:
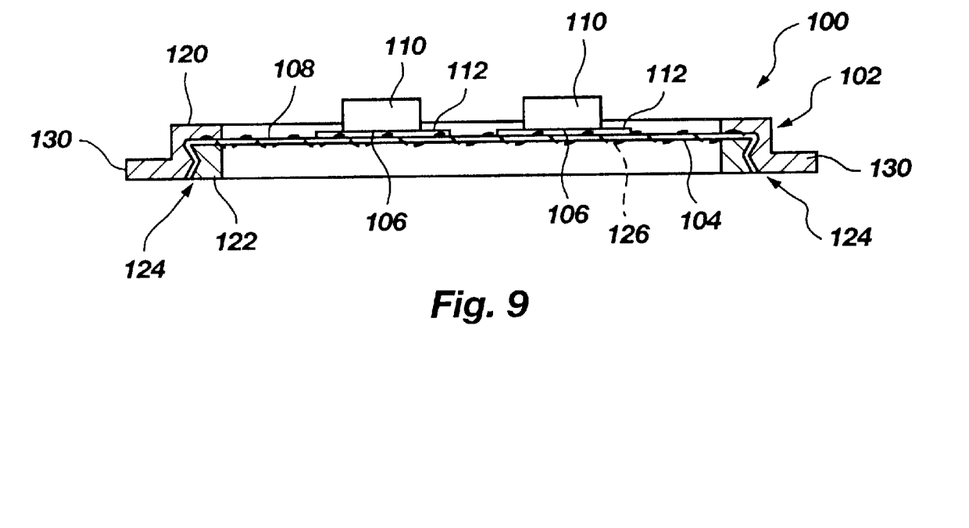
FIG. 9 is a side, partial sectional view of a simplified die support structure for a die-pac.
Figure 10:
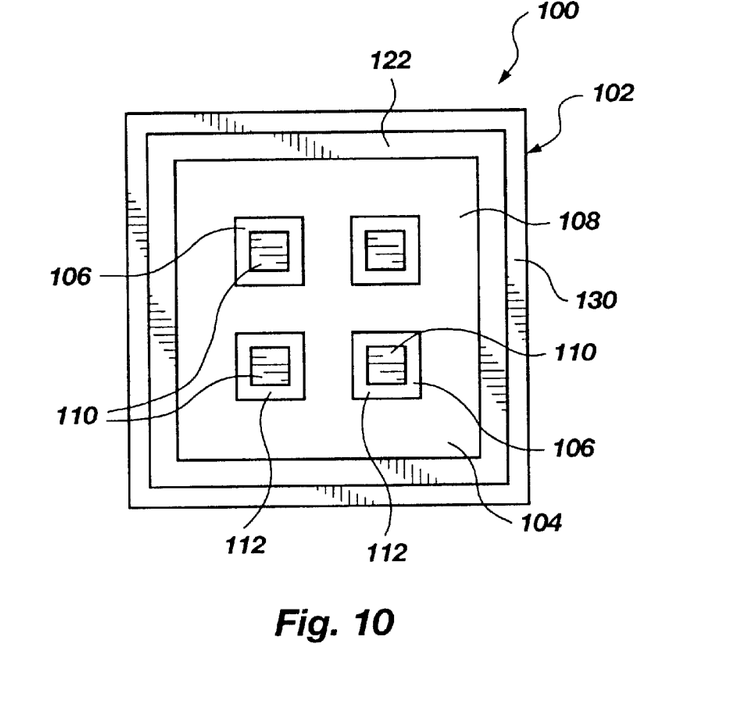
FIG. 10 is a top view of the simplified die support structure of FIG. 9.

Referring now to FIGS. 9 and 10 of the invention, shown is a simplified die support structure 100 usable with the vessel structure 18 of FIG. 4 or as part of a die-pac as illustrated in FIGS. 5, 5A and 6 of the drawings, in lieu of the structures employed therein. Die support structure 100 includes an outer, self-supporting rectangular frame 102 of a material such as black conductive polypropylene, within which is supported a carrier sheet or film 104 of a suitable EMR-penetrable material such as polyvinyl chloride (UV-penetrable) bearing an EMR-sensitive adhesive 106 such as acrylic on at least portions of its upper surface 108. As depicted, die support structure 100 carries four dice 110, adhered to carrier sheet or film 104 by four "dots" 112 of adhesive 106. As an alternative to a completely EMR-penetrable material, sheet or film 104 may comprise an EMR-opaque material patterned with EMR-penetrable inserts such as tape segments applied over apertures in the EMR-opaque material (see also FIG. 5A), or EMR-penetrable segments formed integrally with the EMR-opaque material.

The carrier sheet or film 104 may be stretched taut, and thereafter upper frame member 120 placed thereover in alignment with mating lower frame member 122, the two members 120 and 122 thereafter "snapped" together to maintain carrier sheet or film 104 in its stretched state for support of dice 110. Excess carrier material may then be trimmed from the exterior of frame 102, or a sharp edge, such as 124, formed on one of upper and lower frame members 120 or 122 to sever carrier sheet or film 104 from a larger segment. If desired, the carrier sheet or film 104 may be formed with a supporting webbing 126 similar to webbing 44 of the embodiment of FIG. 6. The webbing 126, shown in broken lines in FIG. 9, may optionally be incorporated within the predominant material of sheet or film 104, or lie above or below it and preferably adhered thereto. Such webbing 126 may assist in maintaining the carrier sheet or film 104 in a taut state during transport and consequent exposure to temperature extremes. Flanges 130 extending from opposing sides of frame 102 may be mated to a cover structure such as 31 (FIG. 5), frame 102 and cover structure 31 then being locked together with clasp brackets 34 or other suitable clamping elements, as previously disclosed with respect to other embodiments.

Figure 11:
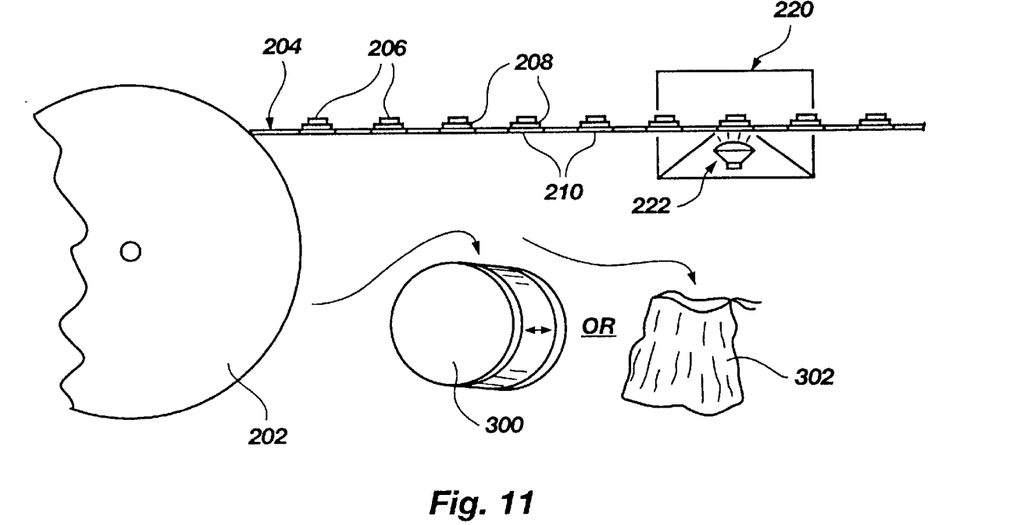
FIG. 11 is a schematic side sectional elevation of a tape-and-reel die transport assembly and associated EMR chamber according to the invention.

FIG. 11 depicts yet another embodiment of the invention, in this instance a tape-and-reel transport assembly 200, herein illustrated with reel 202 feeding a continuous carrier tape 204 bearing a plurality of bare dice 206 secured by EMR-sensitive adhesive segments 208 over EMR-penetrable windows 210 (elements 206, 208 and 210 shown enlarged for clarity) in carrier tape 204 into an EMR chamber 220 to effect release of the dice 206 through sequential exposure to an EMR source 222 within chamber 220. EMR source 222 is preferably placed below and aimed upwardly through carrier tape 204 as it passes through EMR chamber 220. EMR source 222 may be continuously activated, intermittently activated responsive to the presence of a carrier tape-adhered bare die thereover, or continuously activated but shielded by a shutter structure until such time as a carrier tape-adhered bare die is disposed thereover. Reel 202 carrying a tape 204 bearing dice 206 adhered thereto and wound around reel 202 would typically be disposed for transport in a case 300 as known in the art, or at least in an EMR-opaque antistatic bag 302 (both shown in reduced size in FIG. 11). As with the previously-described embodiments, the current best mode of practicing this embodiment employs UV-sensitive adhesives and a UV EMR source.

Figure 12A:
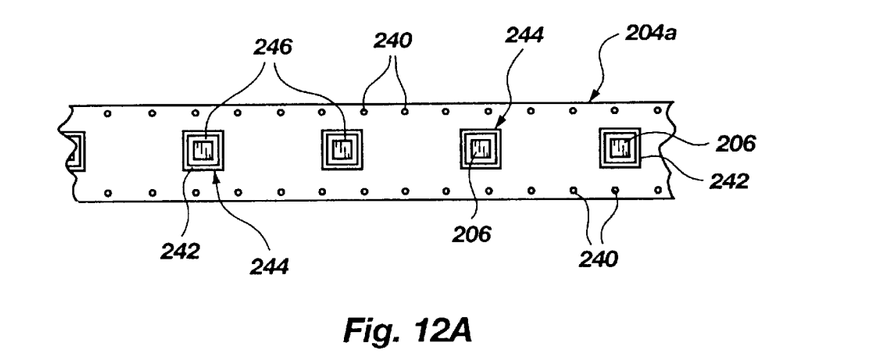
FIGS. 12A and 12B are schematic top views of two die-support tapes of different design employing EMR-sensitive adhesives in different patterns.
Figure 12B:
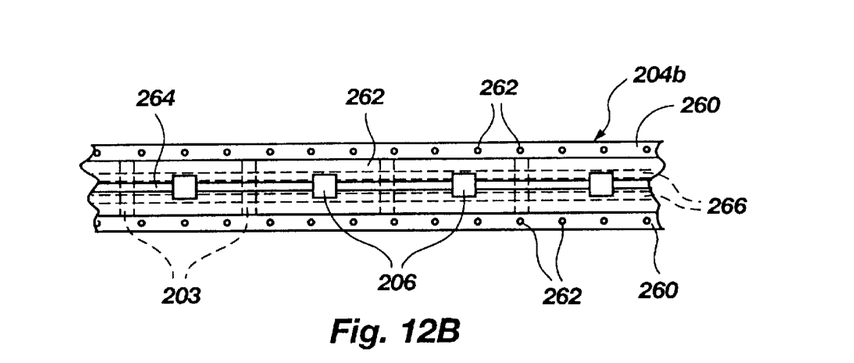

FIGS. 12A and 12B depict several variations in the structure of carrier tape 204 according to the invention. FIG. 12A illustrates a carrier tape 204a having indexing holes 240 at equal intervals along each lateral edge thereof for precise, controlled movement of tape 204a by indexing pins or sprockets as known in the art, such feature being conventional. As tape handling equipment for TAB (tape automated bonding) operations is conventionally most often designed to handle either 35 mm or 70 mm wide tape (depending upon packaged die size), it is contemplated, although not required, that the present invention might be practiced with tapes of those widths so as to facilitate use of existing equipment. Tape 204a may be substantially comprised of a flexible, EMR-opaque metallic or non-metallic (such as synthetic resin) material, and includes EMR-transmissive segments 242 formed therein or placed over apertures formed therein at die placement locations 244. Segments 242 carry an EMR-sensitive adhesive patch 246 on their upper, or carrier, surfaces. Dice 206 are then placed on adhesive patches 246, adhering thereto until they are subsequently released by selective EMR exposure, as previously described. After adherence of dice 206, tape 204a is then wound about a reel 202 for transport, reel 202 then being typically placed in reel case 300 or an EMR-opaque anti-static bag 302. Segments 242 and adhesive patches 246 may be embodied in several ways. For example, segment 242 may comprise an adhesive-coated tape as previously mentioned. Alternatively, adhesive 246 may comprise dots, crosses or X's of adhesive applied through a stencil or by a printing head, or sprayed, onto segments 242.

FIG. 12B depicts a carrier tape 204b comprised of two robust, mutually parallel edge strips 260 containing indexing holes 240, with a continuous intervening die support strip 262 of EMR-transmissive material disposed therebetween. The entire tape 204b or only die support strip 262 may be formed of EMR-transmissive material, as desired or required. The edge strips 260 may be of greater thickness than die support strip 262 to eliminate stretching of tape 204b, and to facilitate the use of a thinner, and thus more EMR-transmissive segment for die support strip 262. Further, edge strips 260 may extend above the upper surface of support strip 262 so as to provide a recessed channel for containing and protecting dice 206 when tape 204b is wound on reel 202. If desired, transversely-extending brace members 263 may extend between edge strips 260 to stabilize the die support areas and reduce the tendency of carrier tape 204b to flex when the dice adhered thereto are retrieved. An EMR-sensitive adhesive may be applied to die support strip 262 in the manner described with respect to FIG. 12A, or, as depicted, may comprise a single continuous adhesive strip 264 or two mutually parallel adhesive strips 266 (shown in broken lines).

Figure 13:
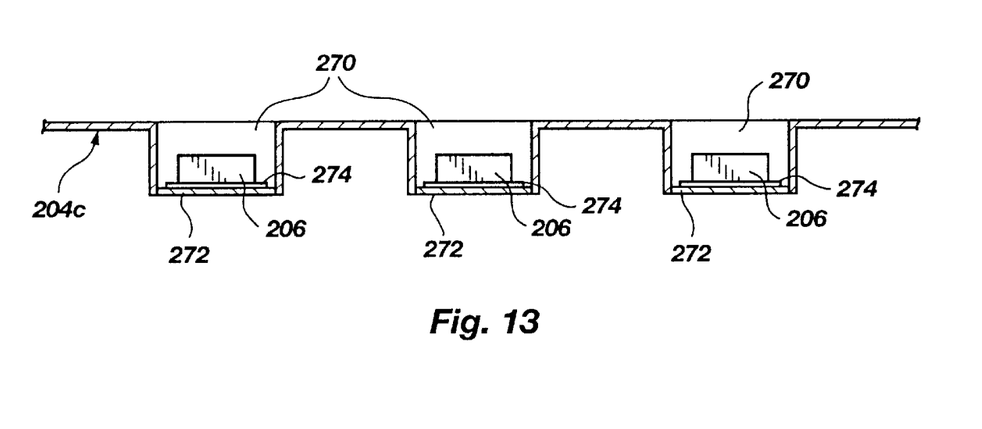
FIG. 13 is an enlarged side sectional view of a die-support tape including die containment cavities.

FIG. 13 depicts an enlarged side sectional view of a segment of a tape 204c, depicting die containment cavities 270 having EMR-penetrable bottoms 272 for carrying and enclosing dice 206 adhered to EMR-sensitive adhesive material 274. When wound on a reel 202, cavities 270 will protect dice 206 on tape 204c against damage and contamination. It should be noted that prior art tape structures employing cavities typically require a lid or shutter over the mouth of each cavity to prevent the enclosed die from falling out, which requirement is eliminated by the present invention.

Figure 14:
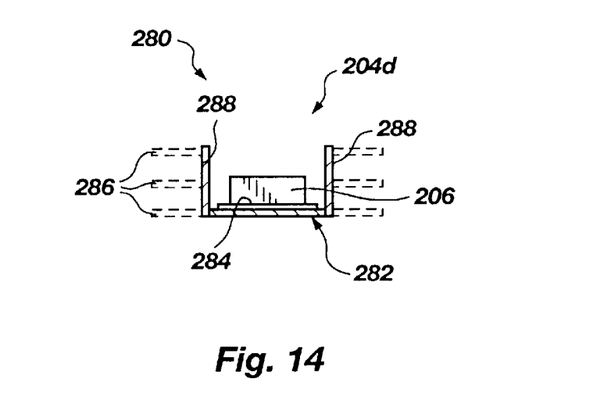
FIG. 14 is a transverse cross-sectional view of a die-support tape defining a continuous channel for receiving dice therein.

FIG. 14 depicts a transverse cross-sectional view of a tape 204d defined by a central channel-shaped member 280, at least the bottom 282 of which is comprised in whole or in segments of an EMR-transmissive material. Longitudinally-spaced dots or segments or a continuous strip or strips of EMR-sensitive adhesive material 284 are applied to bottom 282 inside channel shaped member 280. Dice 206 are carried on adhesive material 284, protected within the confines of channel-shaped member 280. Lateral flanges 286 extend transversely to tape 204d along the length thereof, and may be placed at the upper, midportion or lower extents of the channel sidewalls 288 as shown in broken lines. Flanges 286 may include apertures for engagement by tape-handling mechanisms.

While the preferred embodiments of the invention have been described, additions, deletions and modifications may be made to those illustrated, features of different embodiments combined, and other embodiments devised, without departing from the spirit of the invention and the scope of the appended claims.

What is claimed is:

1. A method for loading, carrying and dispensing semiconductor dice, comprising:

adhering a plurality of singulated dice in spaced relationship along an elongated tape element;

winding said elongated tape element on a reel;

unwinding said elongated tape element;

exposing said adhered singulated dice to EMR within a predetermined wavelength range and reducing the adherence of said adhered singulated dice to said tape element responsive to said EMR exposure.

2. The method of claim 1, wherein said exposing to EMR comprises exposing to light.

3. The method of claim 2, wherein said exposing to light comprises exposing to ultraviolet light.

4. The method of claim 1, wherein said exposure is conducted sequentially at each location of an adhered singulated die.

* * * * *

UNITED STATES PATENT AND TRADEMARK OFFICE
CERTIFICATE OF CORRECTION

PATENT NO. : 5,976,955
DATED : November 2, 1999
INVENTOR(S) : Joe W. Hodges

It is certified that error appears in the above-identified patent and that said Letters Patent is hereby corrected as shown below:

Title page,
Item [56], References Cited, U.S. PATENT DOCUMENTS,
Insert -- 5,010,251    4/1991    Grinberg et al. --
Insert -- 5,285,350    2/1994    Villuame --
Insert -- 5,357,056    10/1994   Nagano -- and
Insert -- 5,408,121    4/1995    Nakamura et al. --
Insert -- 5,523,586    6/1996    Sakurai --

Drawings,
FIG. 12B, change reference numeral "262" (on top, 3$^{rd}$ from left) to -- 240 --; change reference numeral "203" to -- 263 --; and change reference numeral "262" (on bottom, third from left) to -- 240 --

Column 4,
Line 51, after "tape" insert -- 141 --

Column 7,
Line 31, change "anti-static" to -- antistatic --
Line 35, before "246" insert -- patch --

Signed and Sealed this

Sixth Day of August, 2002

*Attest:*

*Attesting Officer*

JAMES E. ROGAN
*Director of the United States Patent and Trademark Office*